United States Patent
Chang et al.

(10) Patent No.: US 6,800,895 B2
(45) Date of Patent: Oct. 5, 2004

(54) VERTICAL SPLIT GATE FLASH MEMORY CELL AND METHOD FOR FABRICATING THE SAME

(75) Inventors: Ming Cheng Chang, Taoyuan Hsien (TW); Cheng-Chih Huang, Taipei Hsien (TW); Jeng-Ping Lin, Taoyuan Hsien (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/272,176

(22) Filed: Oct. 15, 2002

(65) Prior Publication Data

US 2003/0205755 A1 Nov. 6, 2003

(30) Foreign Application Priority Data

May 1, 2002 (TW) .................................. 91109074 A

(51) Int. Cl.$^7$ ............................................. H01L 29/788
(52) U.S. Cl. ...................................................... 257/316
(58) Field of Search .............................. 257/135, 261, 257/301, 302, 315, 316, 330–332; 438/257, 259

(56) References Cited

U.S. PATENT DOCUMENTS

| | | | | |
|---|---|---|---|---|
| 5,049,956 A | * | 9/1991 | Yoshida et al. ............ | 257/317 |
| 5,242,845 A | | 9/1993 | Baba et al. | |
| 5,399,516 A | | 3/1995 | Bergendahl et al. | |
| 5,705,415 A | * | 1/1998 | Orlowski et al. ........... | 438/259 |
| 5,828,602 A | * | 10/1998 | Wong ....................... | 365/185.2 |
| 6,087,222 A | * | 7/2000 | Jung Lin et al. .......... | 438/259 |
| 6,180,980 B1 | * | 1/2001 | Wang ....................... | 257/331 |
| 6,239,465 B1 | * | 5/2001 | Nakagawa ................ | 257/331 |
| 6,255,689 B1 | * | 7/2001 | Lee .......................... | 257/314 |
| 6,344,393 B1 | * | 2/2002 | Liu .......................... | 438/259 |
| 6,433,382 B1 | * | 8/2002 | Orlowski et al. ........... | 257/315 |
| 6,444,525 B1 | * | 9/2002 | Lee .......................... | 438/259 |
| 6,465,836 B2 | * | 10/2002 | Lin et al. .................. | 257/315 |
| 6,531,732 B2 | * | 3/2003 | Sugita et al. ............. | 257/315 |
| 6,541,815 B1 | * | 4/2003 | Mandelman et al. ...... | 257/315 |
| 2001/0038118 A1 | * | 11/2001 | Sakui et al. ............... | 257/315 |

* cited by examiner

*Primary Examiner*—Carl Whitehead, Jr.
*Assistant Examiner*—Jennifer M Dolan
(74) *Attorney, Agent, or Firm*—Merchant & Gould P.C.

(57) ABSTRACT

A vertical split gate flash memory cell. The memory cell includes a substrate, a floating gate, a control gate, a tunnel layer, a first doping region, and a second doping region. The floating gate is disposed in the lower portion of the trench and insulated from the adjacent substrate by a floating gate oxide layer. The control gate is disposed over the floating gate and insulated from the adjacent substrate by a control gate oxide layer. The inter-gate dielectric layer is disposed between the floating gate and the control gate for insulation of the floating gate and the control gate. The first doping region is formed in the substrate adjacent to the control gate and the second doping region is formed in the substrate below the first doping region and adjacent to the floating gate to serve as source and drain regions with the first doping region.

24 Claims, 10 Drawing Sheets

VERTICAL SPLIT GATE FLASH MEMORY CELL AND METHOD FOR FABRICATING THE SAME

BACKGROUND OF THE INVENTION

1. Field of the Invention

The present invention relates in general to a semiconductor device and method for fabricating the same. More particularly, it relates to a vertical split gate flash memory cell that increases integration with ICs.

2. Description of the Related Art

Non-volatile memory, such as flash memory, stores data regardless of electrical power supplied, and reads and writes data by controlling a threshold voltage of a control gate. Conventionally, flash memory includes a floating gate and a control gate. The floating gate stores charge and the control gate reads and writes data. In addition, the floating gate is located under the control gate and is not connected to external circuit, and the control gate connects to the word line. One of the advantages of flash memory is its capacity for block-by-block memory erasure. Furthermore, memory erasure is fast, and normally takes just 1 to 2 seconds for the complete removal of a whole block of memory. Therefore, in recent years, it has been widely applied to consumer electronics devices, such as digital cameras, mobile phones, personal stereos, and laptops.

There is much interest in reducing the size of individual semiconductor devices to increase their density on an integrated circuit (IC) chip. This reduces size and power consumption of the chip, and allows faster operation. In order to achieve a memory cell with a minimum size, the gate length (line width) in a conventional transistor must be reduced to decrease the lateral dimension of the memory cell. However, the conventional process for fabricating flash memory usually uses photomasks to define the devices. Since the precision of the photomasks is limited, misalignment usually occurs for devices with a smaller line width. This causes open circuits or short circuits, and the electrical properties of the flash memory fail. Therefore, the device size of the conventional flash memory is limited by the design rule, so it is difficult to shrink the device size. In addition, short channel effect and hot carrier effect occurs when the line width is shrink, thereby reducing the reliability of devices.

SUMMARY OF THE INVENTION

Accordingly, an object of the invention is to provide a novel vertical split gate flash memory cell to increase the integration of ICs by decreasing the lateral dimension of the memory cell.

Another object of the invention is to provide a novel method for fabricating a vertical split gate flash memory cell to prevent short channel effect, thereby increasing the reliability of devices.

According to one aspect, the invention provides a split gate flash memory cell. The memory cell includes a substrate, a floating gate, a control gate, a tunnel layer, a first doping region, and a second doping region. The floating gate is disposed in the lower portion of the much and insulated from the adjacent substrate by a floating gate oxide layer. The control gate is disposed over the floating gate and insulated from the adjacent substrate by a control gate oxide layer. The inter-gate dielectric layer is disposed between the floating gate and the control gate for insulation between the floating gate and the control gate. The first doping region is formed in the substrate adjacent to the floating gate and the second doping region is formed in the substrate below the fiat doping region and adjacent to the control gate to serve as source and drain regions with the first doping region. The memory cell further includes an insulating layer, a conductive stud, and a gate structure. The insulating layer is disposed over the first doping region. The conductive stud is disposed on the control gate and insulated from the first doping region by an insulating spacer. The gate structure is disposed on the conductive stud to serve as a word line.

According to another aspect, the invention provides a method for fabricating a vertical split gate flash memory cell. First, a substrate having a first trench and a second trench is provided. Next, a conformable floating gate oxide layer is formed over the sidewall and the bottom of each lower portion of the trench. Next, a floating gate is formed over the floating gate oxide layer in each of the lower portion of the trenches. Next a tunnel oxide layer is formed on the floating gate. Next, a conformable control gate oxide layer is formed over the sidewall of each upper portion of trench. Next, a control gate is formed on the inter-gate dielectric layer. Next, ion implantation is performed in the substrate adjacent to the floating gate to form a second doping region. Finally, ion implantation is performed in the substrate adjacent to the control gate to form a first doping region. Moreover, after the control gate is formed, a conductive stud and an insulating spacer are formed on the control gate, wherein the conductive stud is insulated from the first doping region by the insulating spacer. Next, an insulating layer is formed over the first doping region. Next, parts of the conductive stud, the insulating spacer, the control gate, the control gate oxide layer, the tunnel oxide layer, the floating gate, and the floating gale oxide layer in the first trench are removed to form a third trench. Thereafter, an isolation structure is formed in the third trench. Next, a plurality of gate structures is formed over the insulating layer and the trenches.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF TEE INVENTION

Figure 1:
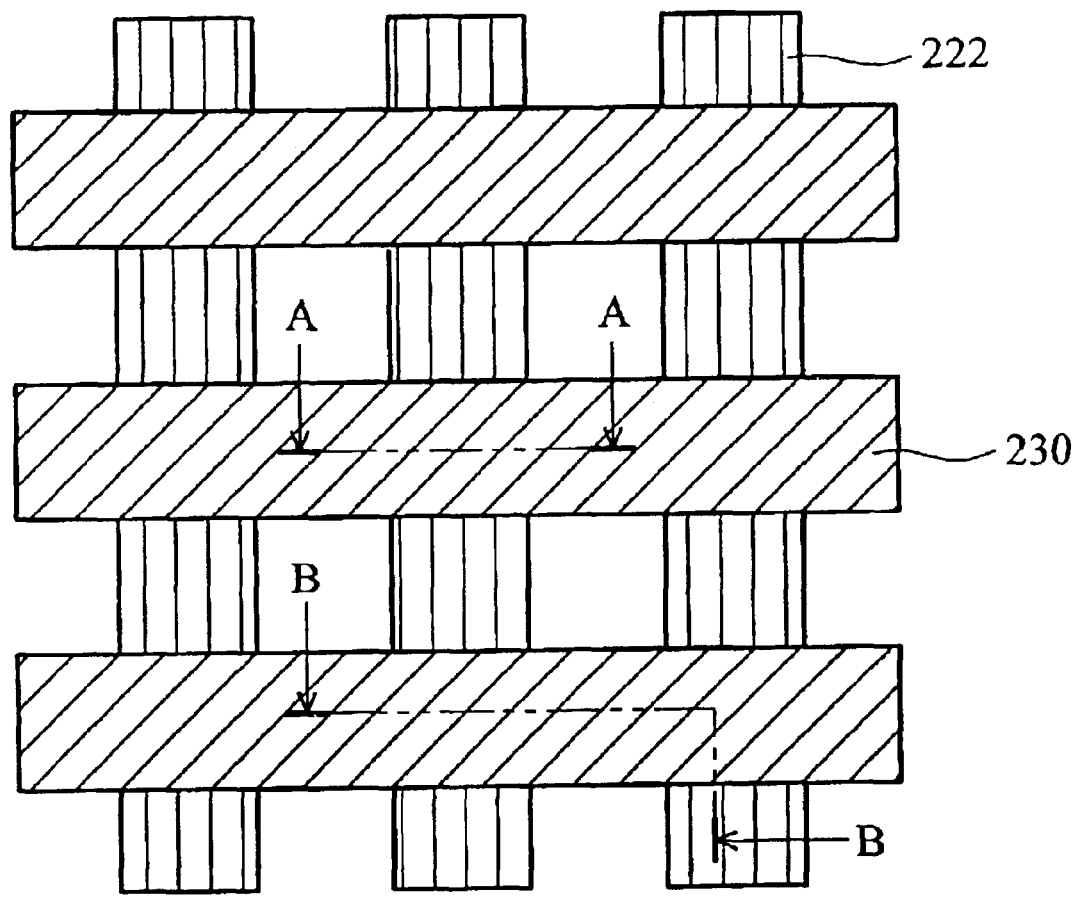
FIG. 1 is a plane view showing a vertical split gate flash memory cell according to the present invention.
Figure 2:
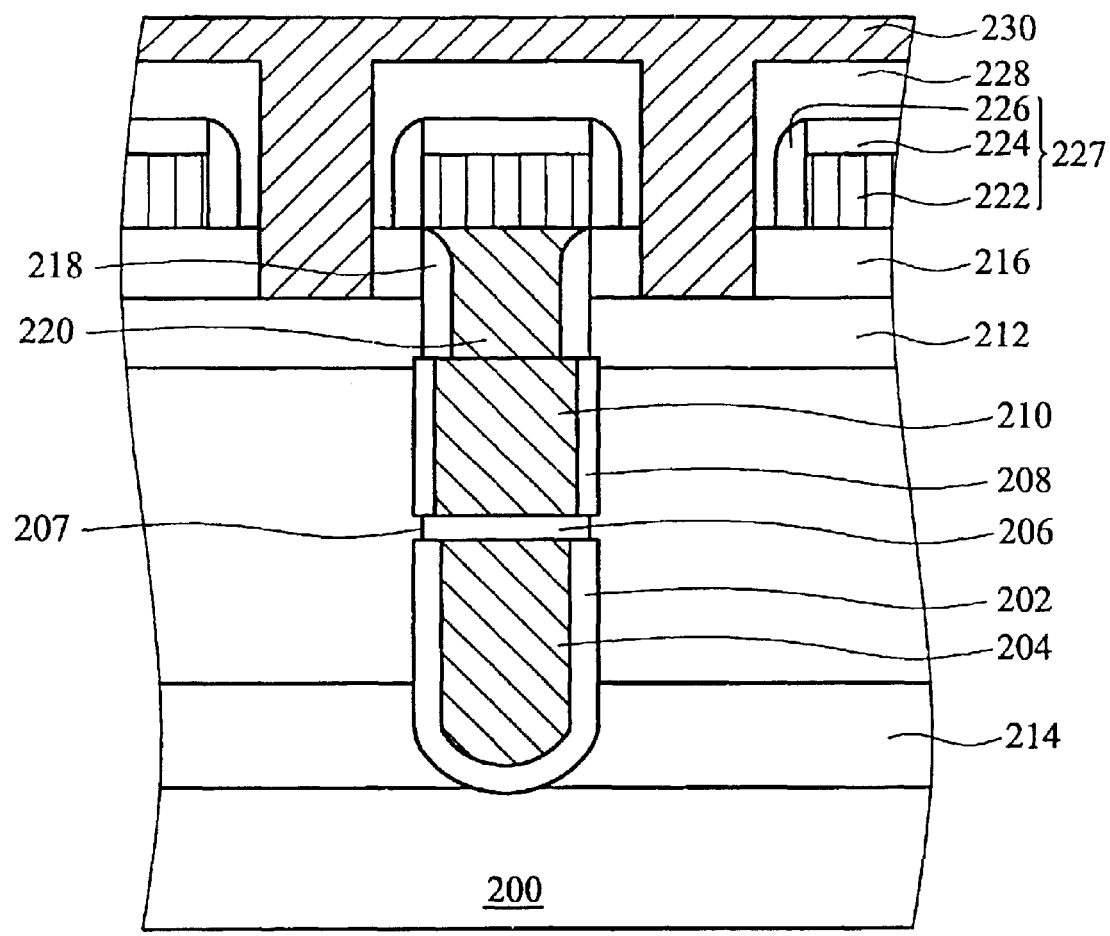
FIG. 2 is a cross-section showing a vertical split gate flash memory cell along A—A line in FIG. 1.
Figure 3:
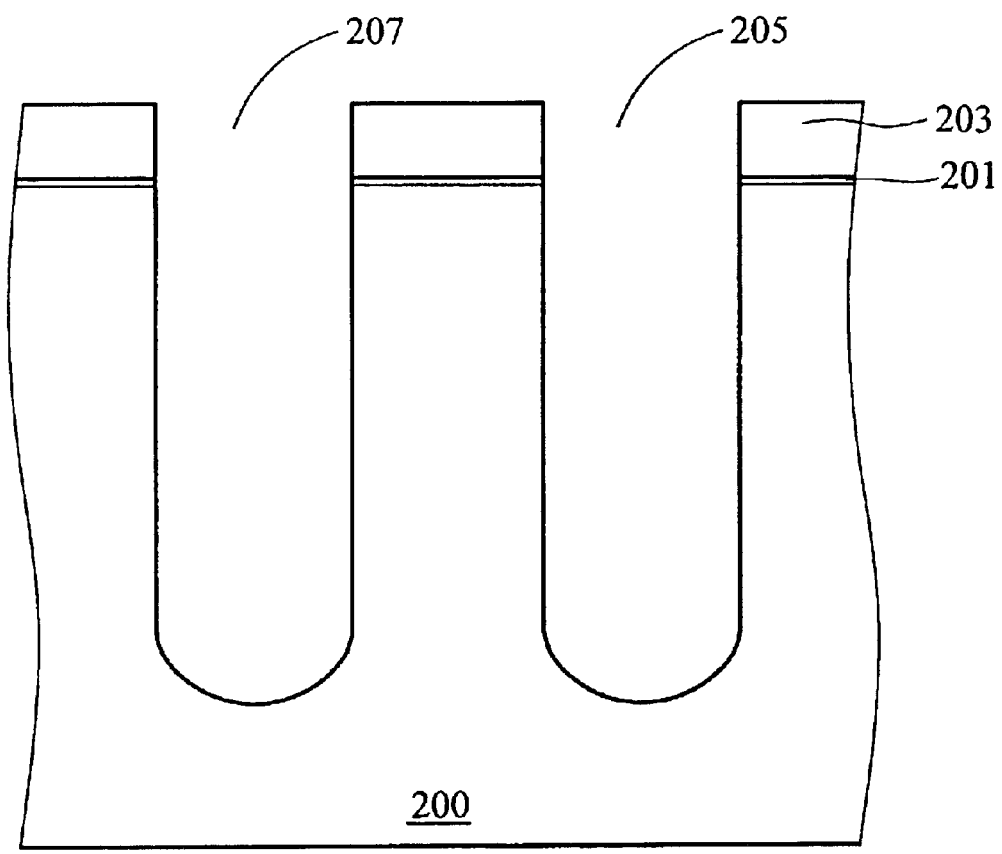
FIGS. 3–10 are cross-sections showing a method for fabricating a vertical split gate flash memory cell according to the present invention.

FIG. 1 shows a plane view of a vertical split gate flash memory cell having gate layer 222 and interconnect layer 230. FIG. 2 shows a cross-section of a vertical split gate flash memory cell along A—A line in FIG. 1. The memory cell includes a substrate 200, such as a p-type silicon substrate, having a deep trench 207. A floating gate is disposed in the lower portion of the trench 207. The floating gate 204 can be polysilicon and is insulated from the adjacent substrate 200 by a floating gate oxide layer 202. A control gate 210 is disposed over the floating gate 204 in the upper portion of the trench 207. Also, the control gate 210 can be polysilicon and is insulated from the adjacent substrate 200 by a control gate oxide layer 208. A inter-gate dielectric layer 206 is disposed between the floating gate 204 and the control gate 210 for insulation of the floating gate 204 and the control gate 210. In this invention, the inter-gate dielectric layer 206 has a thickness of about 100–500 Å. Preferably, the inter-gate dielectric layer 206 has a thickness of about 300 Å. A doping region 212, such as an n-type doping region, is formed in the substrate 200 adjacent to the control gate 210 and another doping region 214, such as n-type doping region, is formed in the substrate 200 adjacent to the floating gate 204. Doping region 212, 214 save as drain region and source drain of the flash memory cell, respectively, thereby forming two vertical channels (not shown) in the substrate 200 at both sides of the trench 207. An insulating layer 216, such as a silicon oxide layer, is disposed over the doping region 212 and has openings (not shown) to expose the doping region 212. A conductive stud 220 is disposed on the control gate 210 and insulated firm the doping region 212 by an insulating spacer 218. In this invention, the conductive stud 220 can be polysilicon and the insulating spacer can be silicon nitride. A plurality of gate structures 227 are respectively disposed on the insulating layer 216 and conductive stud 220, wherein the gate structure 227 disposed on the conductive stud 220 serves as a word line of the flash memory cell. The gate structure 227 includes a gate 222, a gate spacer 226, and a cap layer 224. The gate spacer 226 and cap layer 224 can be silicon nitride. An insulating layer 228, such as borophosphsilicate glass (BPSG), is deposited over the insulating layer 216 and gate structure 227. Interconnect layer 230 is formed over the insulating layer 228 and filled in the openings of the insulating layer 216 to connect with the doping region 212. In the invention, the interconnect layer 230 can be tungsten or polysilicon.

FIGS. 3–10 shows cross-sections of a method for fabricating a vertical split gate flash memory cell according to the present invention. First, in FIG. 3, a substrate 200, such as p-type silicon substrate, is provided. A pad oxide layer 201 and a silicon nitride layer 203 are successively deposited on the substrate 200. Subsequently, lithography and etching are performed on the silicon nitride layer 203 and the pad oxide layer 201 to form openings (not shown) and expose the substrate 200. Next, the exposed substrate 200 under the openings is etched by anisotropic etching, such as dry etching, using the silicon nitride layer 203 as a mask to form a plurality trenches. In order to simplify the diagram, only two trenches 205, 207 are shown.

Figure 4:
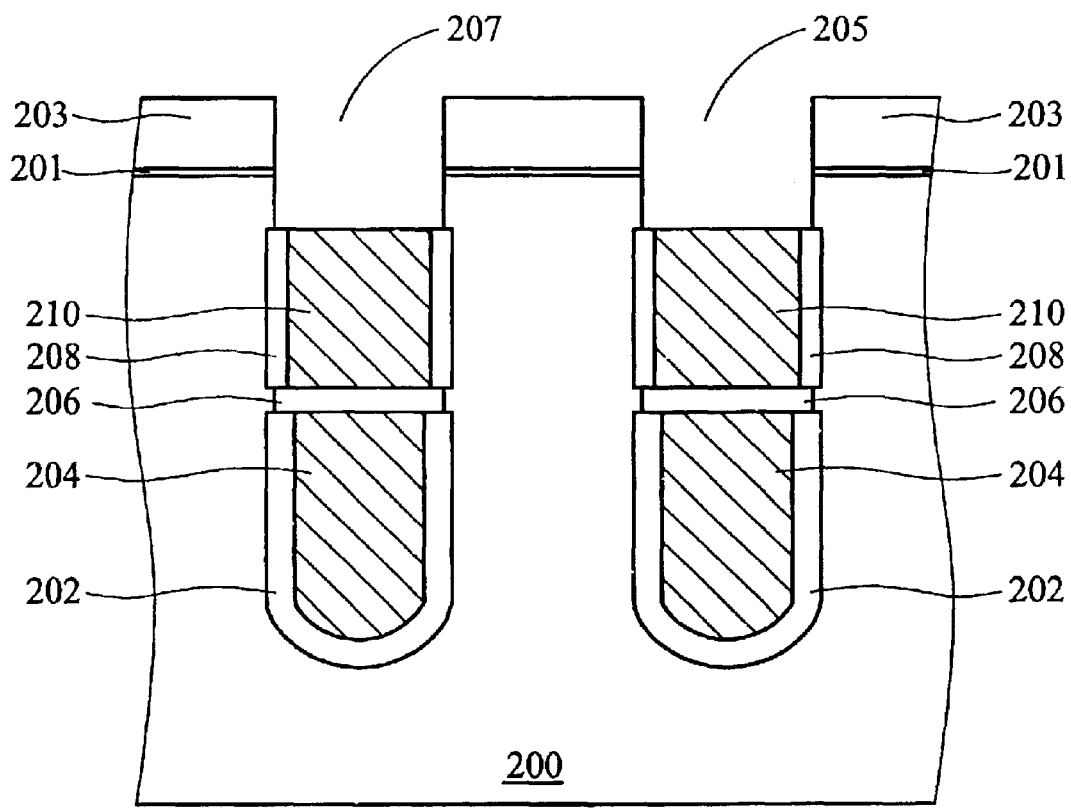

In FIG. 4, conformable floating gate oxide layers 202 are respectively formed over the sidewall and the bottom of the lower portion of the trenches 205, 207 by thermal oxidation or other conventional deposition. Thereafter, floating gates 204 are respectively formed over the floating gate oxide layers 202 in the lower portion of the trenches 205, 207. In this invention, a polysilicon layer (not shown) is deposited on the silicon nitride layer 203 and filled in the trenches 205, 207. Next, the polysilicon layer is etched back to leave part of a polysilicon layer in each of the trenches 205, 207, to serve as floating gates. The height of the floating gate oxide layer is substantially equal to the remained polysilicon layer 204.

Next, a conformable silicon oxide layer (not shown) is formed over the silicon nitride 203 and the surface of the trenches 205, 207 by conventional deposition, such as chemical vapor deposition (CVD). Subsequently, the silicon oxide layer over the silicon nitride 203 and the sidewall of the trenches 205, 207 is removed to leave a silicon oxide layer 206 on the floating gate 204. The remaining silicon oxide layer 206 serve as a inter-gate dielectric layer, which has a thickness of about 100–500 Å.

Also, conformable control gate oxide layers 208 are formed over the sidewall of the upper portion of the trenches 205, 207 by thermal oxidation or other conventional deposition. Thereafter, a control gate 210, such as polysilicon, is formed on the inter-gate dielectric layer 206. As shown in FIG. 4, the height of the control gate 210 is substantially equal to the control gate oxide layer 208 and both are lower than the top surface of the substrate 200.

Figure 5:
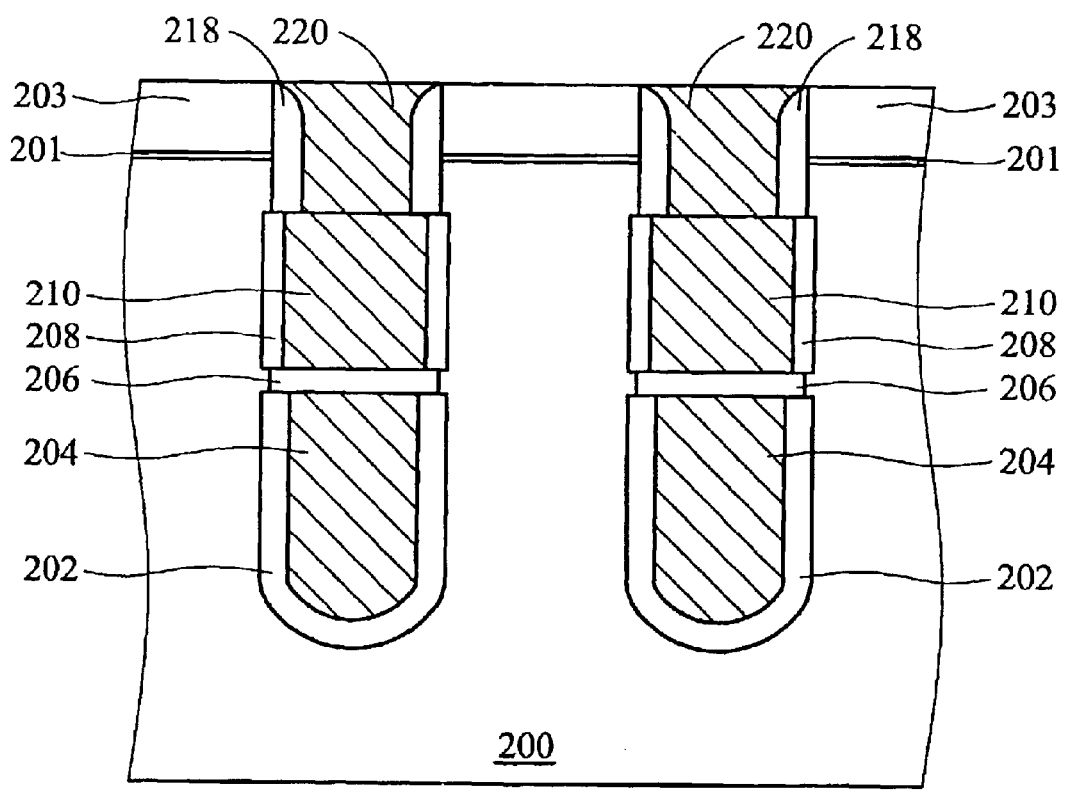

Next, in FIG. 5, after the control gate 210 is formed, a conductive stud 220 and an insulating spacer 218 are formed on the control gate 210. In this invention, the conductive stud can be polysilicon and the insulating spacer 218 can be silicon nitride.

Figure 6:
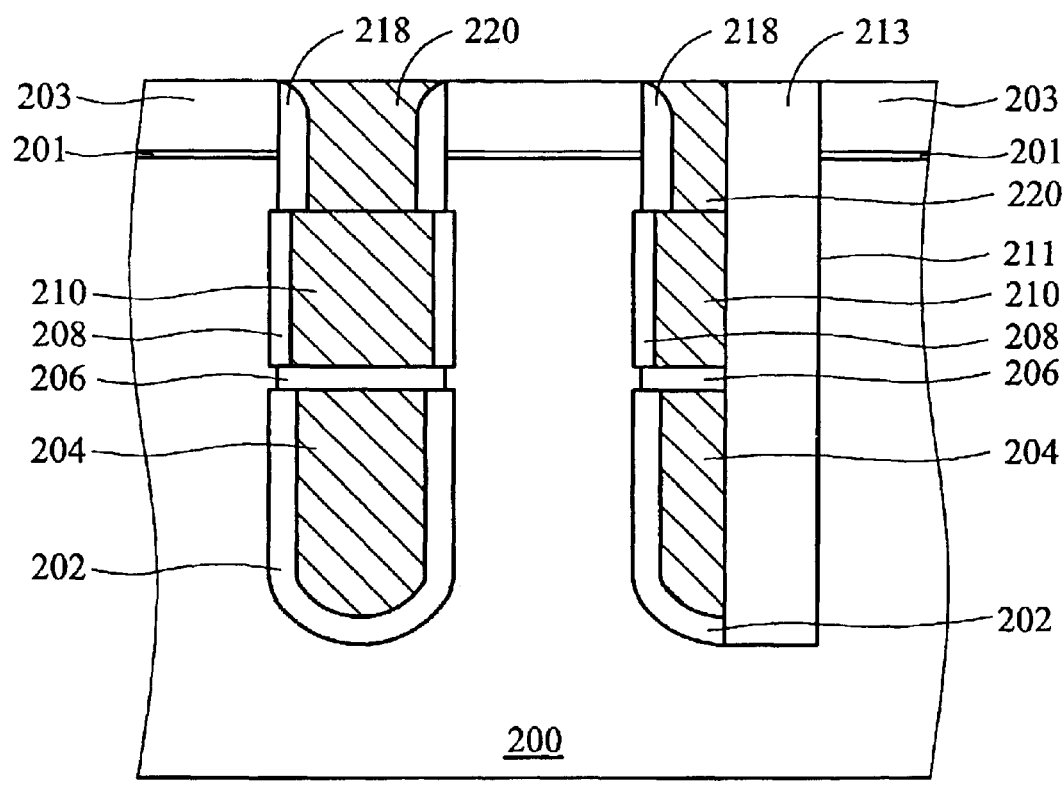

Next, in FIG. 6, parts of the conductive stud 220, the insulating spacer 218, the control gate 210, the control gate oxide layer 208, the inter-gate dielectric layer 206, the floating gate 204, and the floating gate oxide layer 202 in the trench 205 are removed by lithography and etching to form a trench 211. Thereafter, silicon oxide (not shown) is filled in the trench 211 by CVD, such as high-density plasma CVD (HDPCVD), to form an isolation structure 213.

Figure 7:
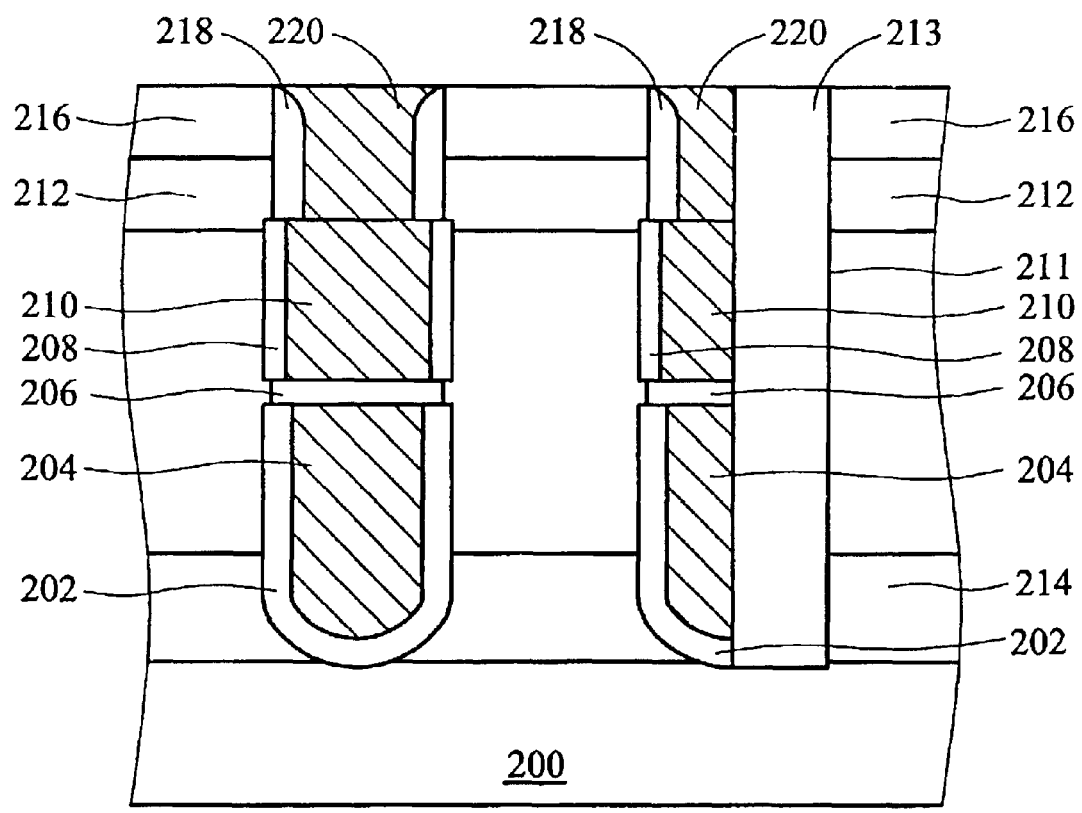

Next, in FIG. 7, after the silicon nitride layer 203 is removed, ion implantation is performed in the substrate 200 adjacent to the floating gate 204 to form a doping region 214, such as an n-type doping region. Subsequently, ion implantation is performed again in the substrate 200 adjacent to the control gate 210 to form a doping region 212, such as an n-type doping region. These n-type doping region 212, 214 serve as drain region and source region of the vertical split gate flash memory cell of the invention. In addition, the conductive stud 220 is insulated from the n-type doping region 212 by the insulating spacer 218. Next, an insulating layer 216, such as a silicon oxide layer, is deposited on the n-type doping region 212 by conventional deposition, such as CVD, to make its height substantially level with the conductive stud 220 and insulating spacer 21B.

Figure 8:
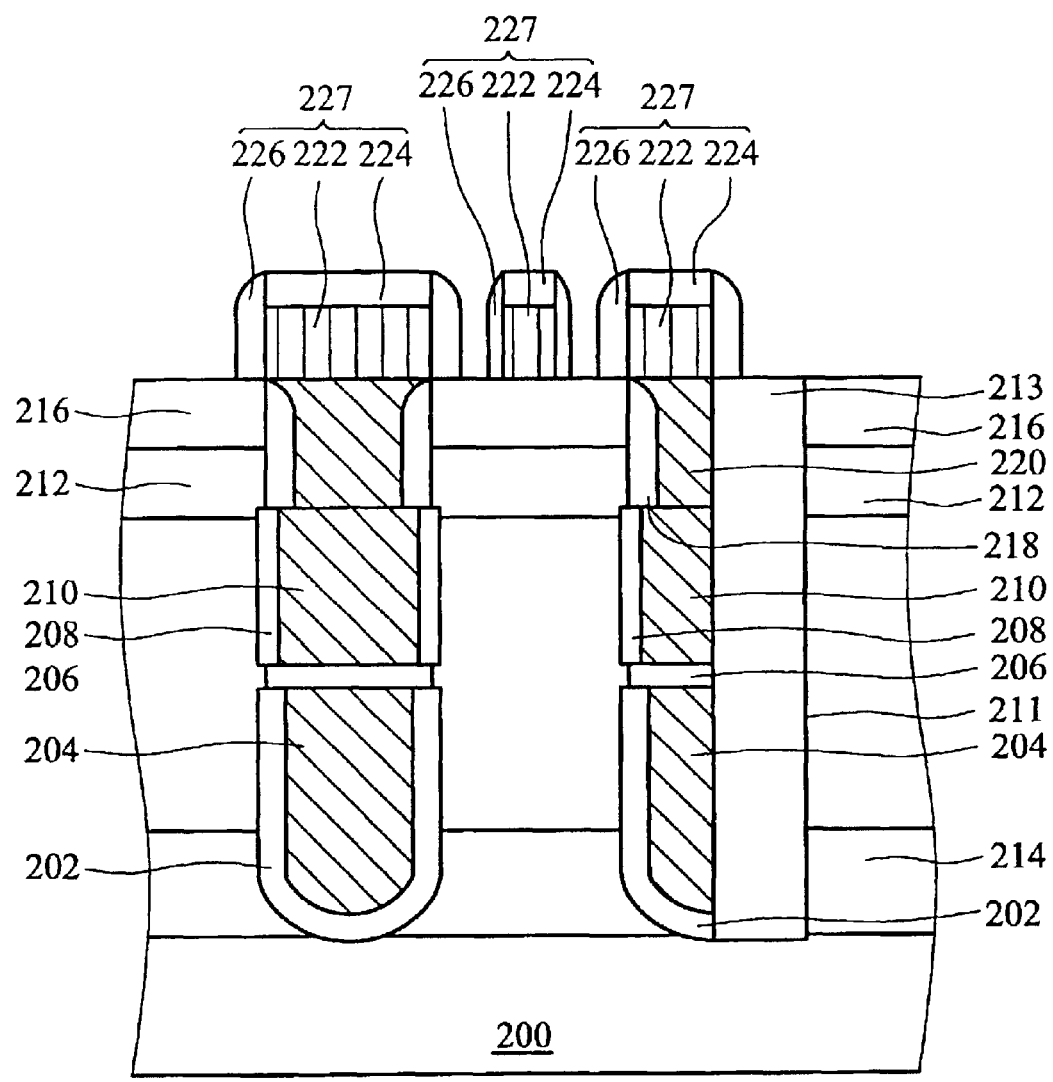

Next, in FIG. 8, a plurality of gate structures 227 are formed over the insulating layer 216 and the trenches 205, 207. Each gate structure 227 includes a gate 222, a gate spacer 226, and a cap layer 224, wherein the gate spacer 226 and the cap layer 224 can be silicon nitride.

Figure 9:
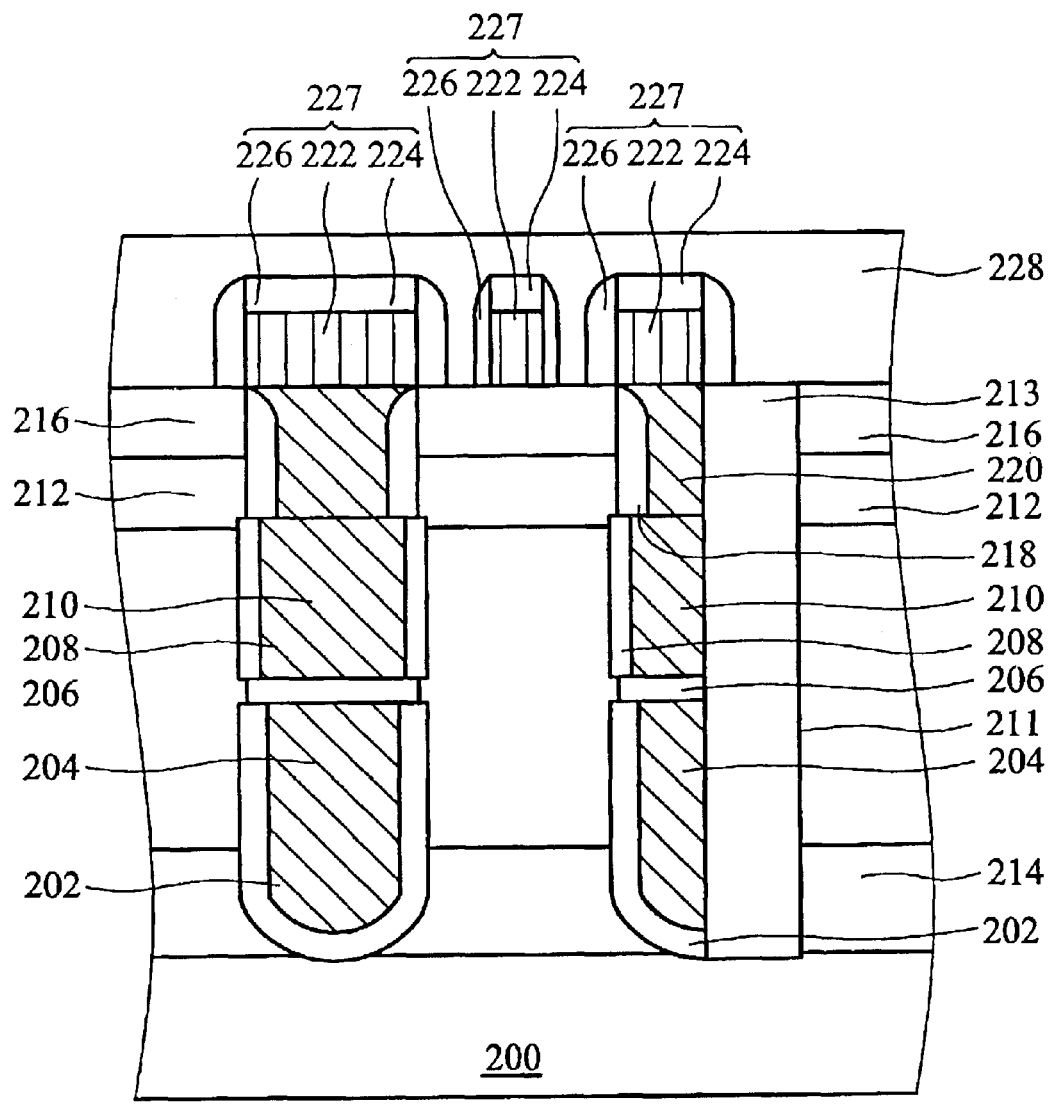
Figure 10:
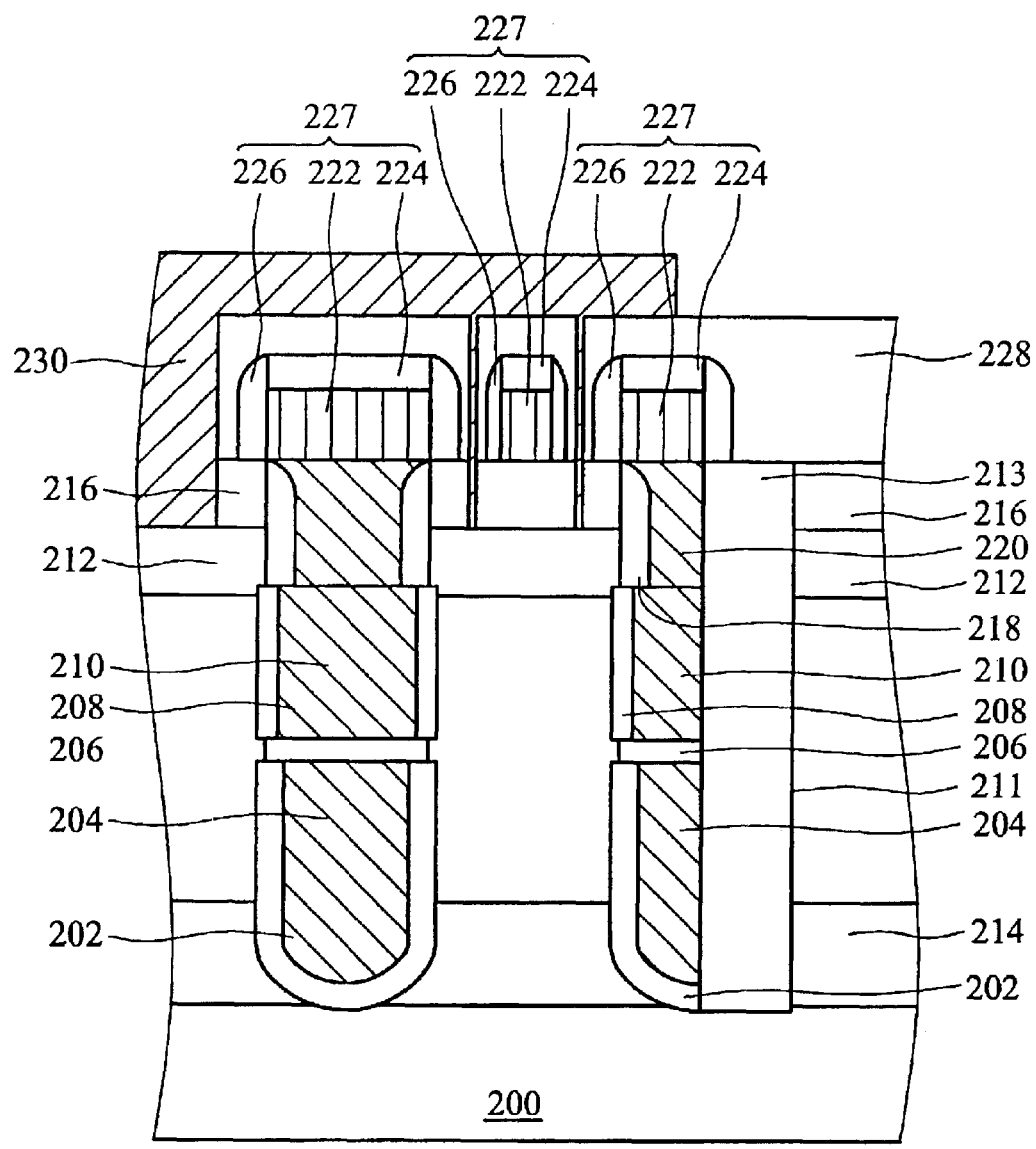

Next, in FIG. 9, an insulating layer 228, such as BPSG, is deposited over the insulating layer 216 and gate structures 227. Finally, FIG. 10 shows a cross-section along B—B line in FIG. 1, in which the insulating layer 228 is patterned by lithography and etching to expose part of doping region 212 in the substrate 200. Next, an interconnect layer 230 is formed over the gate structures 227 and connected with the exposed doping region 212. In this invention, the interconnect layer 230 can be tungsten or polysilicon.

Since the channel of the vertical split gate flash memory cell according to the invention is vertical, the integration of ICs can be effectively increased due to decreased lateral dimension of the memory cell compared with the prior art. Moreover, in the invention, the channel length is not based on the line width, but based on the depth of the trench. That is, the short channel effect or hot carrier effect as mentioned in the prior art cannot occur even when line width is shrunk. Therefore, the reliability of the devices can be increased.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A vertical split gate flash memory cell, comprising:

a substrate having a trench;

a columnar floating gate disposed in the lower portion of the trench and insulated from the adjacent substrate by a floating gate oxide layer uniformly extended around the bottom of the columnar floating gate;

a columnar control gate disposed over the floating gate and below the top of the trench, having a bottom area not smaller than an upper area of the floating gate, and insulated from the adjacent substrate by a control gate oxide layer;

an inter-gate dielectric layer disposed between the floating gate and the control gate for insulation between the floating gate and the control gate;

a first doping region formed in the substrate adjacent to the control gate; and a second doping region formed in the substrate below the first doping region and adjacent to the floating gate to serve as source and drain regions with the first doping region.

2. The memory cell as claimed in claim 1, further comprising:

an insulating layer disposed over the first doping region;

a conductive stud disposed on the control gate and insulated from the first doping region by an insulating spacer; and a gate structure disposed on the conductive stud to serve as a word line.

3. The memory cell as claimed in claim 2, wherein the insulating layer is silicon oxide.

4. The memory cell as claimed in claim 2, wherein the conductive stud is polysilicon.

5. The memory cell as claimed in claim 2, wherein the insulating spacer is silicon nitride.

6. The memory cell as claimed in claim 2, wherein the gate structure includes a gate, a gate spacer, and a cap layer.

7. The memory cell as claimed in claim 6, wherein the gate spacer and the cap layer are silicon nitride.

8. The memory cell as claimed in claim 1, wherein the substrate is a p-type silicon substrate.

9. The memory cell as claimed in claim 1, wherein the first and second doping regions are n-type doping regions.

10. The memory cell as claimed in claim 1, wherein the floating gate is polysilicon.

11. The memory cell as claimed in claim 1, wherein the control gate is polysilicon.

12. The memory cell as claimed in claim 1, wherein the inter-gate dielectric layer has a thickness of about 100–500 Å.

13. A vertical split gate flash memory cell, comprising:

a substrate having a trench;

a columnar floating gate disposed in the lower portion of the trench and insulated from the adjacent substrate by a floating gate oxide layer uniformly extended around the bottom of the floating gate;

a control gate disposed over the floating gate, having a bottom area not smaller than an upper area of the floating gate, and insulated from the adjacent substrate by a control gate oxide layer, all of the control gate being disposed above the floating gate and below the top of the trench;

an inter-gate dielectric layer disposed between the floating gate and the control gate for insulation between the floating gate and the control gate;

a first doping region formed in the substrate adjacent to the control gate; and a second doping region formed in the substrate below the first doping region and adjacent to the floating gate to serve as source and drain regions with the first doping region.

14. The memory cell as claimed in claim 13, further comprising:

an insulating layer disposed over the first doping region;

a conductive stud disposed on the control gate and insulated from the first doping region by an insulating spacer; and a gate structure disposed on the conductive stud to serve as a word line.

15. The memory cell as claimed in claim 14, wherein the insulating layer is silicon ode.

16. The memory cell as claimed in claim 14, wherein the conductive stud is polysilicon.

17. The memory cell as claimed in claim 14, wherein the insulating spacer is silicon nitride.

18. The memory cell as clamed in claim 14, wherein the gate structure includes a gate, a gate spacer, and a cap layer.

19. The memory cell as claimed in claim 18, wherein the gate spacer and the cap layer are silicon nitride.

20. The memory cell as claimed in claim 13, wherein the substrate is a p-type silicon substrate.

21. The memory cell as claimed in claim 13, wherein the first and second doping regions are n-type regions.

22. The memory cell as claimed in claim 13, wherein the floating gate is polysilicon.

23. The memory cell as claimed in claim 13, wherein the control gate is polysilicon.

24. The memory cell as claimed in claim 13, wherein the inter-gate dielectric layer has a thickness of about 100–500 Å.

* * * * *